United States Patent
Nam

(10) Patent No.: US 8,486,822 B2
(45) Date of Patent: Jul. 16, 2013

(54) SEMICONDUCTOR DEVICE HAVING DUMMY PATTERN AND THE METHOD FOR FABRICATING THE SAME

(75) Inventor: Byung Ho Nam, Daegu-Si (KR)

(73) Assignee: SK hynix Inc., Icheon-si (KR)

( * ) Notice: Subject to any disclaimer, the term of this patent is extended or adjusted under 35 U.S.C. 154(b) by 90 days.

(21) Appl. No.: 13/018,358

(22) Filed: Jan. 31, 2011

(65) Prior Publication Data

US 2011/0212619 A1    Sep. 1, 2011

Related U.S. Application Data

(62) Division of application No. 11/763,182, filed on Jun. 14, 2007, now Pat. No. 7,902,671.

(30) Foreign Application Priority Data

Dec. 29, 2006  (KR) .......................... 10-2006-0138774

(51) Int. Cl.
    *H01L 21/4763*    (2006.01)
(52) U.S. Cl.
    USPC ..................... 438/618; 438/926; 257/E21.435
(58) Field of Classification Search
    USPC ................... 438/926; 257/E21.435
    See application file for complete search history.

(56) References Cited

U.S. PATENT DOCUMENTS

| | | | |
|---|---|---|---|
| 6,001,733 A * | 12/1999 | Huang et al. | 438/633 |
| 6,380,087 B1 * | 4/2002 | Gupta et al. | 438/692 |
| 2002/0151131 A1 | 10/2002 | Mori | |
| 2005/0194616 A1 | 9/2005 | Yoon et al. | |
| 2005/0280120 A1 * | 12/2005 | Tomita | 257/620 |
| 2007/0034962 A1 | 2/2007 | Kang et al. | |
| 2007/0224795 A1 * | 9/2007 | Chen et al. | 438/597 |

FOREIGN PATENT DOCUMENTS

| KR | 10-2006-0039296 | 5/2006 |
|---|---|---|
| KR | 10-2006-0073818 | 6/2006 |

* cited by examiner

*Primary Examiner* — Daniel Whalen
(74) *Attorney, Agent, or Firm* — Marshall, Gerstein & Borun LLP

(57) ABSTRACT

A method for fabricating a semiconductor device includes forming an interlayer dielectric film on a semiconductor substrate including a pattern region and a dummy region, forming a photoresist pattern on the interlayer dielectric film such that the pattern region and the dummy region are partially exposed, etching the interlayer dielectric film exposed through the photoresist pattern as an etching mask to form a contact hole and a dummy contact hole, filling the contact hole and the dummy contact hole with a conductive material to form a contact plug and a dummy plug, depositing a semiconductor layer on the contact plug and the dummy plug, and subjecting the semiconductor layer to patterning to form a semiconductor layer pattern and a dummy pattern.

7 Claims, 5 Drawing Sheets

SEMICONDUCTOR DEVICE HAVING DUMMY PATTERN AND THE METHOD FOR FABRICATING THE SAME

CROSS-REFERENCES TO RELATED APPLICATIONS

This is a divisional application which is based on and claims priority to U.S. application Ser. No. 11/763,182 entitled "Semiconductor Device Having Dummy Pattern And The Method For Fabricating The Same," filed Jun. 14, 2007 now U.S. Pat. No. 7,902,671, which, in turn, claims the priority benefit under 35 USC §119 of Korean patent application number 10-2006-138774, filed on Dec. 29, 2006, the entire disclosures of which are hereby incorporated by reference herein in their entirety.

BACKGROUND OF THE INVENTION

This patent relates to a semiconductor device. More specifically, this patent relates to a semiconductor device having a dummy pattern and a method for fabricating the semiconductor device which are capable of preventing defects caused by lifting of a dummy pattern.

A recent trend toward high-integration semiconductor devices, e.g., dynamic random access memories (DRAMs) has brought about a reduction in size of design rule and a decrease in fabrication margin. Accordingly, based on fine processing applied to a semiconductor substrate, a great number of patterns are being formed within the limited area of the semiconductor substrate. During the formation of the great number of patterns on the semiconductor substrate, there arises a difference in level (hereinafter, it is referred to as a "step") among the patterns formed on the substrate.

Meanwhile, such a step may be more readily formed in a pattern dense region, as compared to a pattern loose region. More specifically, the thickness of the film deposited in the pattern dense region is relatively larger than that of the pattern loose region, thus creating a step between the regions. An excessive step between the regions causes deterioration of device characteristics. Accordingly, there are used a variety of methods in an attempt to offset the step prior to the following process. Of these methods, there is a method for introducing a dummy pattern into the pattern dense region.

FIGS. 1 to 3 are views illustrating conventional dummy patterns. FIGS. 2 and 3 are cross-sectional views taken along the line A-A' and the B-B' of FIG. 1, respectively.

Referring to FIGS. 1 to 3, an etching stop film 102 is arranged on a semiconductor substrate 100 where underlying structures including word lines and lit lines are formed. An interlayer dielectric film 104 is arranged on the etching stop film 102. A wire layer 106 is arranged on the interlayer dielectric film 104. There is a difference in density of the wire layer 106 between adjacent regions. A contact plug 108 is arranged in the interlayer dielectric film 104. The contact plug 108 connects the underlying structures arranged on the semiconductor substrate to the wire layer 106. Each dummy pattern 110 reduces the step between the regions having different pattern densities.

The dummy pattern 110 reducing the step is attached to the surface of the interlayer dielectric film 104. During cleaning and heating, after photolithography, there occur defects, e.g., lifting or detachment of the dummy pattern 110. To prevent the occurrence of the defects, there has been suggested a decrease in the size of the dummy pattern 110. The decrease in the size of the dummy pattern 110 makes it impossible to reduce the step to the desired level and causes deterioration of device characteristics resulted from the dummy pattern defects such as lifting or detachment.

BRIEF SUMMARY OF THE INVENTION

A semiconductor device having a dummy pattern and a method for fabricating the semiconductor device are capable of preventing defects of a dummy pattern for use in reducing a step.

In one embodiment, there is provided a semiconductor device having a dummy pattern comprising: a semiconductor substrate including a pattern region and a dummy region; an interlayer dielectric film arranged on the semiconductor substrate; a semiconductor layer pattern arranged on the interlayer dielectric film in the pattern region; a dummy pattern arranged on the interlayer dielectric film in the dummy region; a contact plug arranged inside the interlayer dielectric film, and the contact plug connecting the semiconductor layer pattern to the semiconductor substrate; and a dummy plug arranged inside the interlayer dielectric film, the dummy plug corresponding to the dummy pattern.

The hole size of the dummy plug may be smaller or larger than the hole size of the contact plug. The depth of the dummy plug may be preferably smaller than the depth of the contact plug.

The dummy region may preferably include at least one dummy plug equal to the number of the dummy pattern.

The dummy plug may be preferably made of the same material as the contact plug.

There may also be provided a method for fabricating a semiconductor device having a dummy pattern comprising: forming an interlayer dielectric film on a semiconductor substrate including a pattern region and a dummy region; forming a photoresist pattern on the interlayer dielectric film such that the pattern region and the dummy region are partially exposed; etching the interlayer dielectric film exposed through the photoresist pattern as an etching mask to form a contact hole and a dummy contact hole; filling the contact hole and the dummy contact hole with a conductive material to form a contact plug and a dummy plug; depositing a semiconductor layer on the contact plug and the dummy plug; and subjecting the semiconductor layer to patterning to form a semiconductor layer pattern and a dummy pattern.

The dummy contact hole may be preferably formed such that the size of the dummy contact hole is smaller or larger than the size of the contact hole. The dummy contact hole may be preferably formed such that the depth of the dummy contact hole is smaller than the depth of the contact hole.

At least one dummy contact hole may be preferably formed in the dummy region.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION

Figure 1:
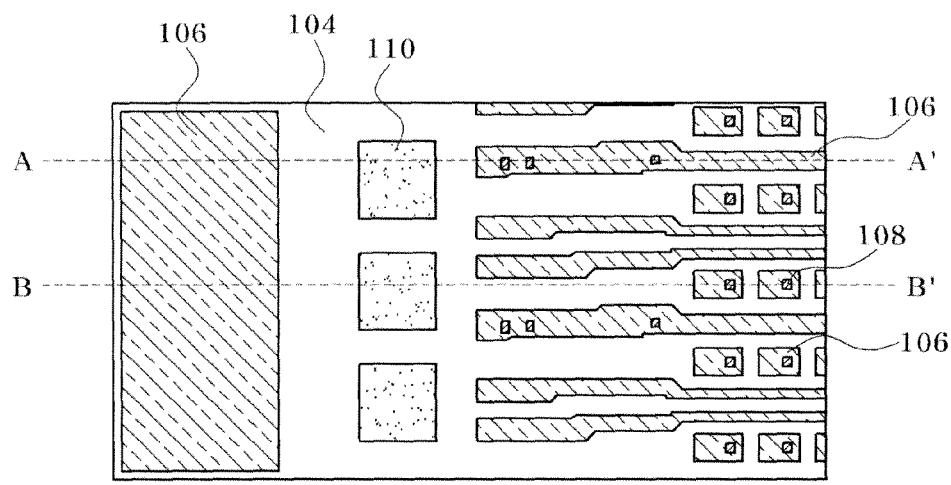
FIGS. 1 to 3 are views illustrating a conventional dummy pattern.
Figure 2:
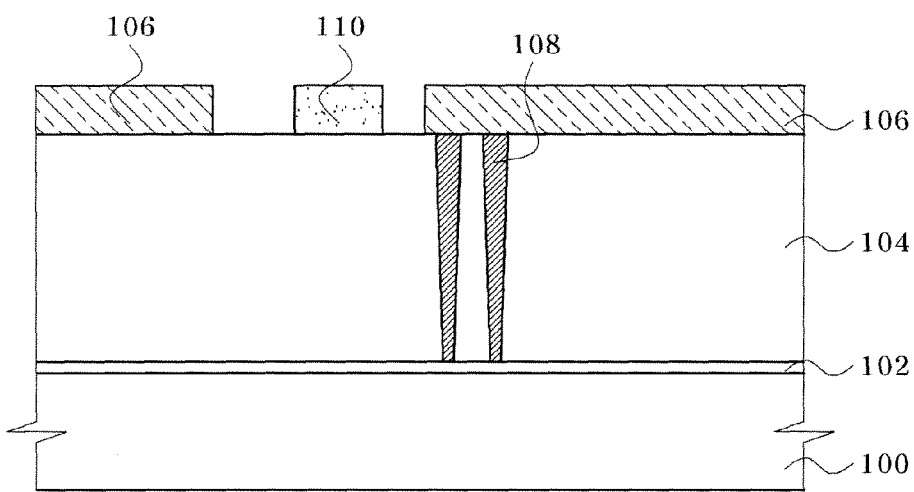
Figure 3:
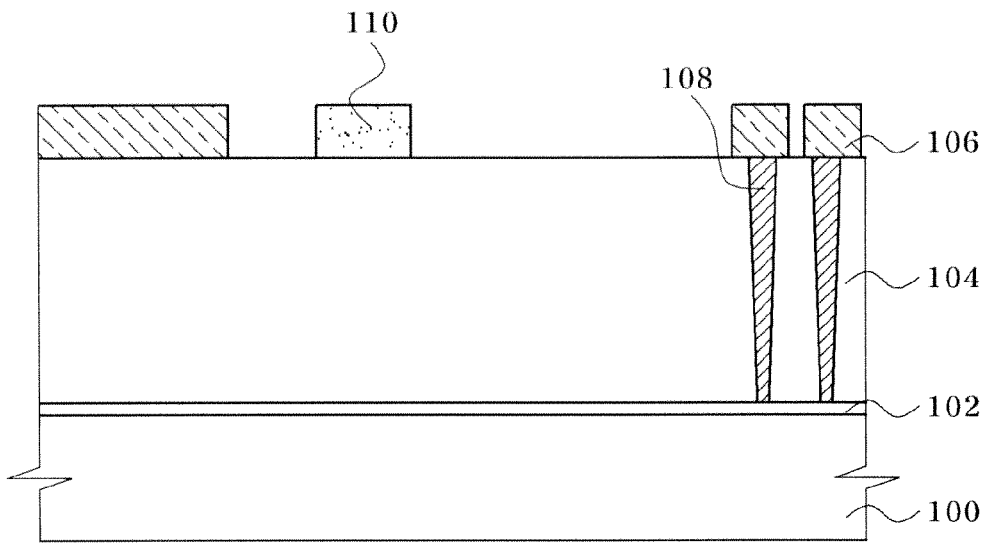

Exemplary embodiments of the present invention will now be described in detail with reference to the accompanying drawings. In the drawings, the thickness of each element in the drawings is enlarged for a better understanding of the present invention. Throughout the disclosure, the same or similar elements are denoted by the same reference numerals.

FIGS. 4 to 9 are cross-sectional views illustrating a method for fabricating a semiconductor device having a dummy pattern according to one embodiment of the present invention.

Figure 4:
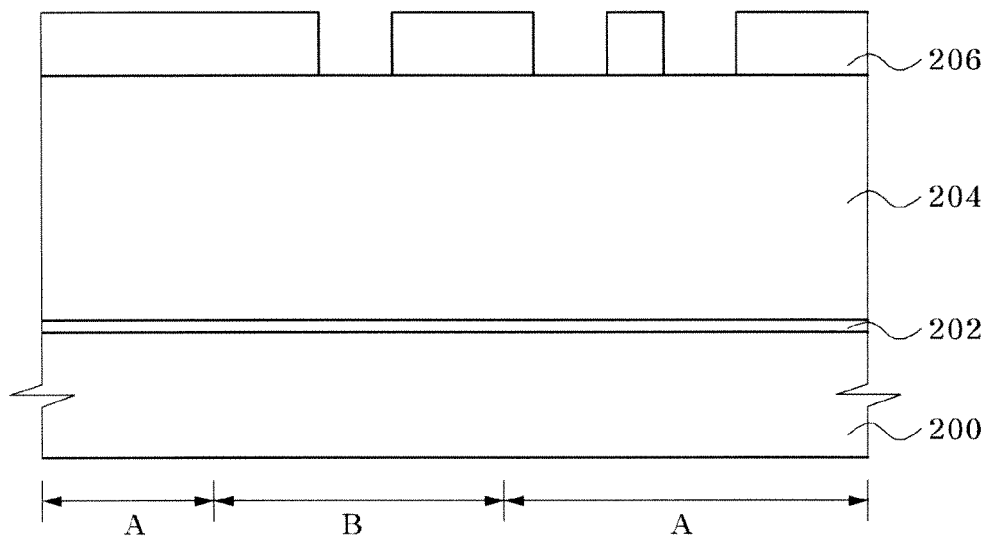
FIGS. 4 to 9 are cross-sectional views illustrating a method for fabricating a semiconductor device having a dummy pattern according to one embodiment of the present invention.

Referring to FIG. 4, an etching stop film 202 is formed on a semiconductor substrate 200 including a pattern region A and a dummy region B. The semiconductor substrate 200 includes the pattern region A where patterns are formed, and the dummy region B arranged between the adjacent patterns. The dummy region is where dummy patterns are formed to reduce the step between adjacent regions having different pattern densities.

The underlying structures (not shown) such as transistors and bit lines are formed on the semiconductor substrate 200. An interlayer dielectric film 204 is formed on the etching stop film 202. A mask film pattern 206, through which the pattern region A and the dummy region B are partially exposed, is formed on the interlayer dielectric film 204. The mask film pattern 206 may be made of a photoresist material.

Figure 5:
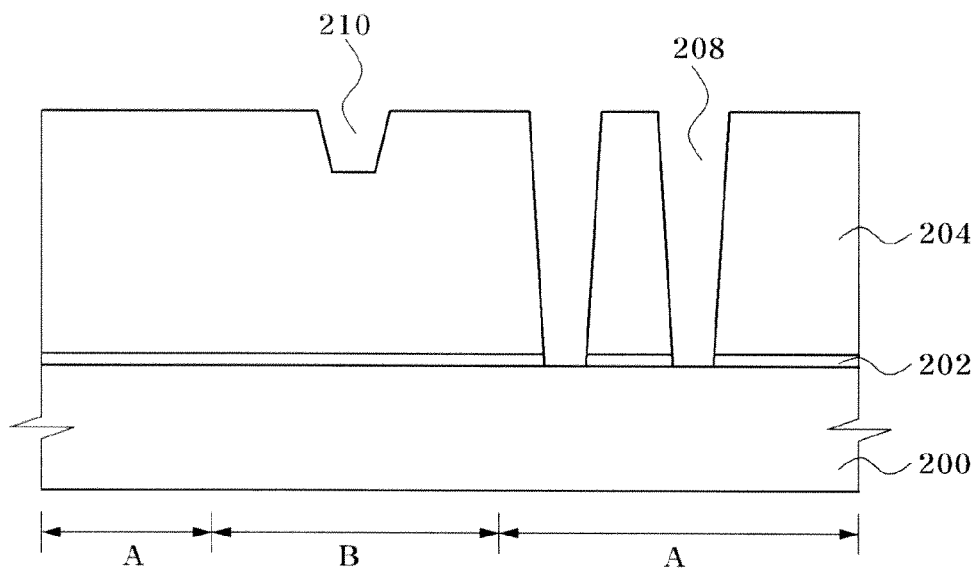

Referring to FIG. 5, the exposed regions of the interlayer dielectric film 204 and the etching stop film 202 are etched using the mask film pattern 206 as an etching mask to form a contact hole 208 and a dummy contact hole 210. The contact hole 208 is formed on the interlayer dielectric film 204 in the pattern region A. The etching is preferably carried out until the etching stop film 202 is exposed to the outside. The contact hole 208 formed in the pattern region A connects the underlying structure to a semiconductor layer pattern formed made of a conductive material on the semiconductor substrate 200 in the following process. The dummy contact hole 210 is formed in the dummy region B. The depth of the dummy contact hole 210 is preferably smaller than that of the contact hole 208 formed in the pattern region A. More specifically, the etching is preferably carried out to a predetermined depth such that the dummy contact hole 210 floats on the interlayer dielectric film 204, and that the etching stop film 202 is not exposed to the outside. That is, the hole size of the dummy contact hole 210 is smaller or larger than that of the contact hole 208. The number of the dummy contact hole 210 may be varied depending upon the number of the dummy pattern. Then, the mask film pattern 206 may be removed by stripping.

Figure 6:
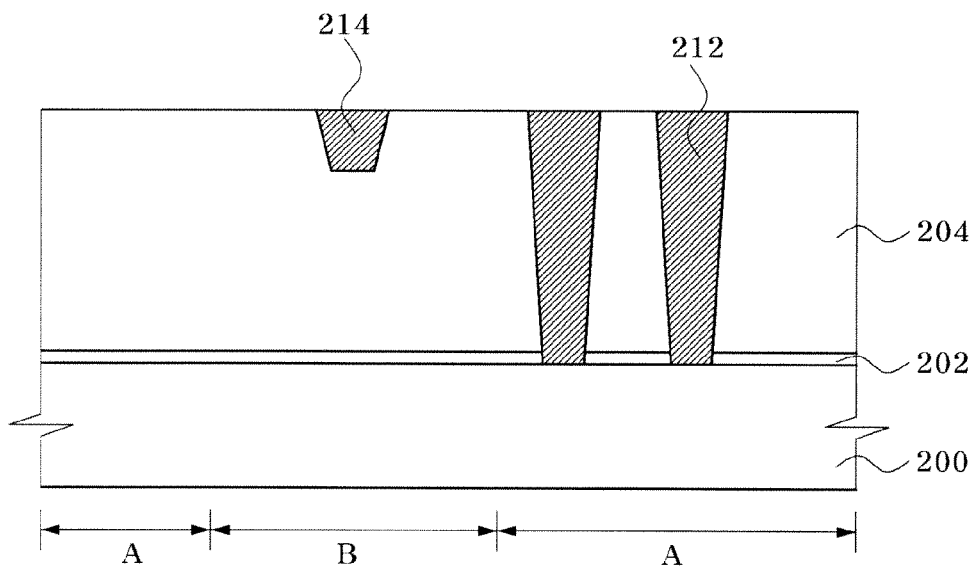

Referring to FIG. 6, a conductive material is deposited on the semiconductor substrate 200 to fill the contact hole 208 and the dummy contact hole 210. The top of the resulting structure including the semiconductor substrate 200 is subjected to planarization such that the surface of the interlayer dielectric film 204 is exposed to the outside, thereby forming a contact plug 212 and a dummy contact plug 214 in the pattern region A and the dummy region B, respectively. The planarization is carried out by chemical mechanical polishing (CMP) or etch-back. The contact plug 212 connects the semiconductor layer pattern to be formed in the following process to the underlying structure (not shown) including transistors and bit lines arranged on the semiconductor substrate 200. Since the dummy contact plug 214 is connected to a dummy contact to be formed in the following process, and is adhered thereto, it prevents collapse of the dummy pattern caused by lifting thereof or detachment thereof from the interlayer dielectric film.

Figure 7:
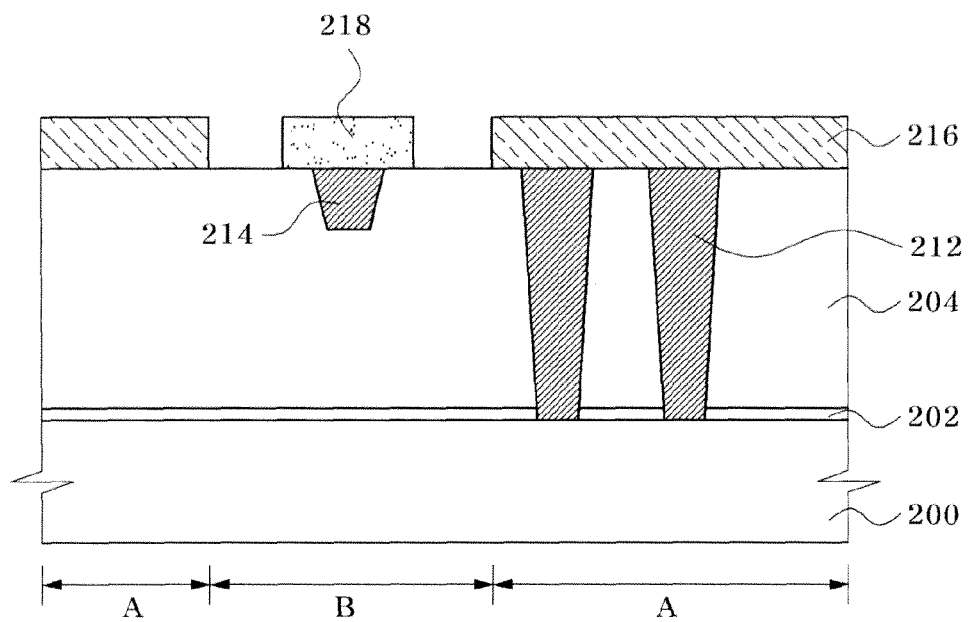

Referring to FIG. 7, a semiconductor layer is deposited on the semiconductor substrate including the contact plug 212 and the dummy contact plug 214. The semiconductor layer is subjected to patterning to form a semiconductor layer pattern 216 and a dummy pattern 218 in the pattern region A and the dummy region B, respectively. The semiconductor layer pattern arranged in the pattern region A is connected to the underlying structure (e.g., transistors) arranged on the semiconductor substrate 200 via the contact plug 212. At this time, the dummy pattern 218 is in contact with the dummy contact plug 214, and thus being fixed in the dummy region. The dummy pattern 218 serves as a buffer layer offsetting the step between adjacent regions having different pattern densities. The formation of the dummy pattern 218 in the dummy region B may be simultaneous with the formation of the semiconductor layer pattern in the pattern region A. In this case, the dummy pattern 218 may be made of the same material as the semiconductor layer pattern 216. The semiconductor layer pattern 216 and the dummy pattern 218 are made of at least one selected from the group consisting of aluminum (Al), copper (Cu), tungsten (W), tungsten silicide (WSix) and zirconium oxide (ZrO3). The dummy pattern 218 has one shape selected from triangular, quadrangular, circular and trapezoidal shapes. In conventional methods, an increased size of the dummy pattern 218 causes pattern defects, e.g., lifting or detachment. On the other hand, in the method according to an embodiment of the present invention, the dummy plug 214 corresponding to the dummy pattern 218 fixes the dummy pattern 218, thus avoiding an occurrence of the defects. The resulting structure including the semiconductor substrate 200 is subjected to cleaning and heat-treatment. During the cleaning and heat-treatment, the dummy pattern 218 is fixed on the interlayer dielectric film 204 via the dummy plug 214, thus causing no pattern defect, e.g., lifting, detachment, or collapse.

Figure 8:
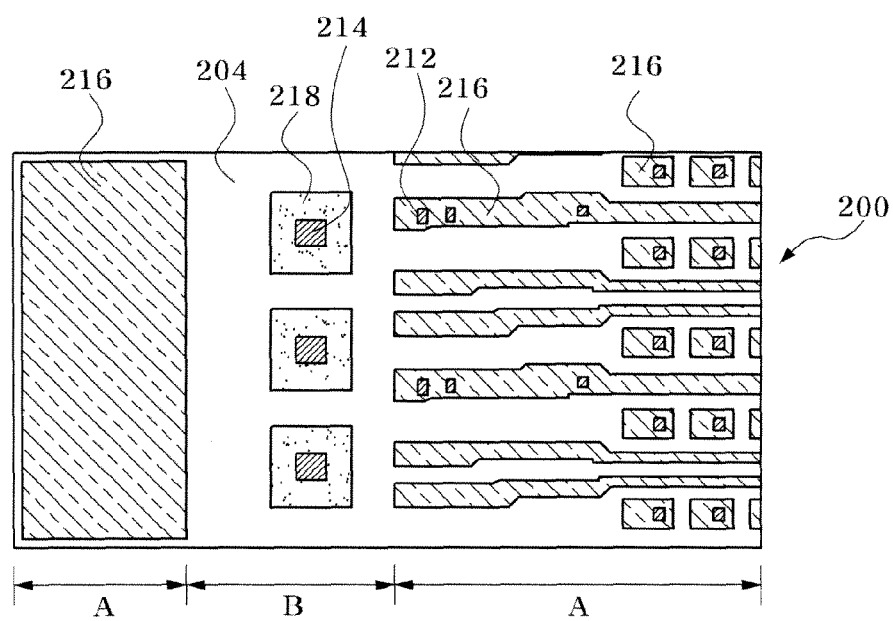

FIG. 8 is a plan view illustrating the structure of a semiconductor device on which the dummy plug 214 and the dummy pattern 218 are arranged. As shown in FIG. 8, the dummy pattern 218 is arranged in the dummy region B arranged between the pattern regions A, and the dummy plug 214 supporting the dummy pattern 218 is arranged inside the dummy pattern 218.

Figure 9:
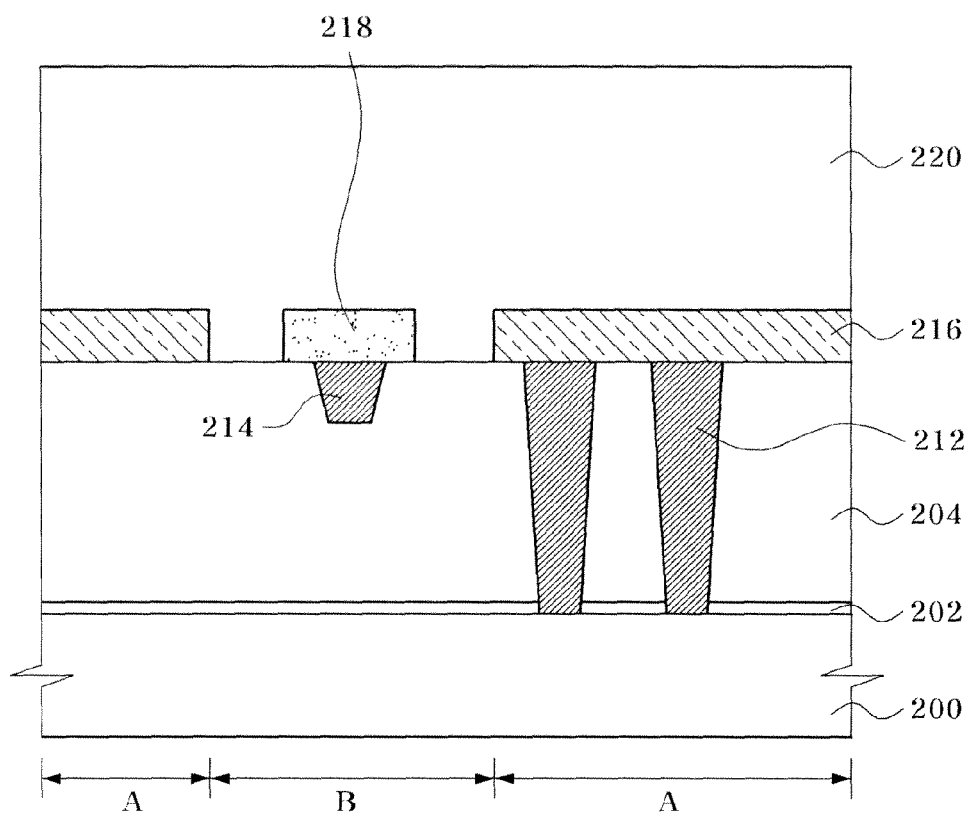

Referring to FIG. 9, an interlayer dielectric film 220 is formed on the semiconductor substrate 200 including the semiconductor layer pattern 216 and the dummy pattern 218. During the formation of the interlayer dielectric film 220, the dummy pattern 218 arranged in the dummy region B contributes to reducing the step between adjacent regions having different densities.

In the semiconductor device having the dummy pattern and the method for fabricating the device according to embodiments of the present invention, the dummy pattern is fixed on the interlayer dielectric film via the dummy plug arranged in the dummy region where there is no contact plug, thus avoiding the occurrence of pattern defects, e.g., lifting, detachment, and collapse. The dummy plug prevents an occurrence of pattern failure caused by dense formation of dummy patterns used to minimize the influence by a partial step. As a result, the margin of the photolithography etching can be increased. Furthermore, the deterioration in device characteristics caused by pattern failure can be inhibited. The semiconductor device and the method for fabricating the device according to embodiments of the present invention may be widely utilized in applications including a variety of industries, e.g., semiconductor fabrication employing photolithography, and micro electro mechanical systems (MEMSs) as well as semiconductor devices, e.g., DRAM, flash, and logic devices. Furthermore, the present invention may be employed as test patterns and main chips in semiconductor devices, photo keys, and reference masks of semiconductor measuring instruments.

As apparent from the foregoing, the semiconductor device having the dummy pattern and the method for fabricating the device according to embodiments of the present invention reduce pattern defects, e.g., lifting, detachment and collapse. As a result, the present invention provides the advantages of increase in the margin of photolithography etching, and prevention of deterioration in device characteristics caused by pattern failure.

Although preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method for fabricating a semiconductor device having a dummy pattern comprising:

forming an interlayer dielectric film on a semiconductor substrate including a first pattern region, a second pattern region, and a dummy region wherein the dummy region is located between the first pattern region and the second pattern region;

forming a photoresist pattern having open regions on the interlayer dielectric film such that the first pattern region and the dummy region are partially exposed by the open regions;

etching the interlayer dielectric film exposed through the photoresist pattern as an etching mask to form contact holes in the first pattern region and a dummy contact hole in the dummy region;

filling the contact holes and the dummy contact hole with a conductive material to form contact plugs and a dummy plug;

depositing a semiconductor layer on the interlayer dielectric film comprising the contact plugs and the dummy plug;

forming a first semiconductor layer pattern contacting top surfaces of the contact plugs in the first pattern region and forming a second semiconductor layer pattern in the second pattern region by patterning the semiconductor layer, wherein the first semiconductor layer pattern and the second semiconductor layer pattern have different pattern densities; and forming the dummy pattern on the interlayer dielectric film of the dummy region, wherein the dummy pattern contacts a top surface of the dummy plug by patterning the semiconductor layer, wherein the dummy pattern has the same height as the first and second semiconductor layer patterns, and wherein the dummy plug fixes the dummy pattern on the interlayer dielectric film.

2. The method according to claim 1, wherein the dummy contact hole is formed such that a size of the dummy contact hole is smaller or larger than a size of the contact holes.

3. The method according to claim 1, wherein the dummy contact hole is formed such that a depth of the dummy contact hole is smaller than a depth of the contact holes.

4. The method according to claim 1, wherein at least one dummy contact hole is formed in the dummy region.

5. The method according to claim 1, wherein the dummy region includes a number of dummy plugs equal to a number of dummy patterns.

6. The method according to claim 1, wherein the dummy plug is formed of the same material as the contact plugs.

7. The method according to claim 1, wherein the contact plugs are formed in the interlayer dielectric film while contacting with the semiconductor substrate and the dummy plug is formed in the interlayer dielectric film without contacting the semiconductor substrate.

\* \* \* \* \*